(12) United States Patent
Doerr et al.

(10) Patent No.: US 12,463,112 B2
(45) Date of Patent: Nov. 4, 2025

(54) COOLING DEVICE

(71) Applicant: Robert Bosch GmbH, Stuttgart (DE)

(72) Inventors: Aaron Doerr, Bietigheim-Bissingen (DE); Marco Lorenz, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 686 days.

(21) Appl. No.: 17/791,596

(22) PCT Filed: Nov. 30, 2020

(86) PCT No.: PCT/EP2020/083911
§ 371 (c)(1),
(2) Date: Jul. 8, 2022

(87) PCT Pub. No.: WO2021/139924
PCT Pub. Date: Jul. 15, 2021

(65) Prior Publication Data
US 2023/0335461 A1    Oct. 19, 2023

(30) Foreign Application Priority Data
Jan. 8, 2020   (DE) ..................... 10 2020 200 110.3

(51) Int. Cl.
*H01L 23/427*    (2006.01)
*F28F 1/02*    (2006.01)
(Continued)

(52) U.S. Cl.
CPC ............ *H01L 23/427* (2013.01); *F28F 1/022* (2013.01); *F28F 1/126* (2013.01); *H01L 23/3672* (2013.01); *H01L 23/467* (2013.01)

(58) Field of Classification Search
CPC . H01L 23/427; H01L 23/3672; H01L 23/467; F28F 1/022; F28F 1/126
See application file for complete search history.

(56) References Cited

U.S. PATENT DOCUMENTS 5,998,863 A * 12/1999 Kobayashi ................ F28F 3/12
                                                                361/699
6,041,850 A    3/2000 Esser et al.
(Continued)

FOREIGN PATENT DOCUMENTS

CN    200968795 Y    10/2007
CN    201218681 Y    4/2009
(Continued)

OTHER PUBLICATIONS

Translation of International Search Report for Application No. PCT/EP2020/083911 dated Mar. 4, 2021 (3 pages).

*Primary Examiner* — Eugene Lee
(74) *Attorney, Agent, or Firm* — Michael Best & Friedrich LLP

(57) ABSTRACT

The invention relates to a cooling device (1) for cooling components (101), comprising a baseplate (2) which can be heat-conductively connected to a component (101) to be cooled, a deflection region (3), an intermediate region (4) between the baseplate (2) and the deflection region (3), and a cooling element (5), which is formed in a meandering shape and has multiple central segments (51) and multiple deflection segments (52), wherein the central segments (51) each extend from the baseplate (2) to the deflection region (3), wherein the deflection segments (52) each create a change of direction within the baseplate (2) and within the deflection region (3) and connect two respective central segments (51) to one another, wherein the cooling element (5) is filled with a working material, which is simultaneously gaseous and liquid in the cooling element (5), and wherein the central segments (51) have a plurality of channels (53).

13 Claims, 6 Drawing Sheets

(51) Int. Cl.
  *F28F 1/12* (2006.01)
  *H01L 23/367* (2006.01)
  *H01L 23/467* (2006.01)

(56) References Cited

U.S. PATENT DOCUMENTS

| | | | |
|---|---|---|---|
| 6,470,878 | B1 | 10/2002 | Brown et al. |
| 7,650,928 | B2 * | 1/2010 | Bhatti ................... H01L 23/427 165/104.33 |
| 2005/0121173 | A1 * | 6/2005 | Inagaki ................. F28F 9/0236 257/E23.098 |
| 2009/0101308 | A1 * | 4/2009 | Hardesty ............. F28D 15/0266 165/80.4 |
| 2009/0211743 | A1 * | 8/2009 | Schrader ............... F28F 9/0221 165/173 |
| 2011/0094722 | A1 * | 4/2011 | Mori ..................... H01L 23/473 165/181 |
| 2012/0097369 | A1 * | 4/2012 | Agostini ............... F28F 9/0278 165/104.19 |
| 2013/0077245 | A1 * | 3/2013 | Gradinger ............. H01L 23/427 165/170 |
| 2015/0136358 | A1 * | 5/2015 | Gradinger ............. H01L 23/427 165/80.3 |
| 2015/0323261 | A1 * | 11/2015 | Tseng ................... F28D 15/025 165/104.22 |
| 2015/0369545 | A1 * | 12/2015 | Naritomi ................. F28F 13/06 29/890.03 |
| 2016/0054074 | A1 * | 2/2016 | Agostini ................ H01L 23/427 165/104.26 |
| 2017/0094843 | A1 * | 3/2017 | Agostini ............. F28D 15/0275 |
| 2018/0306484 | A1 * | 10/2018 | Cha ....................... F25D 17/062 |
| 2020/0003497 | A1 * | 1/2020 | Aston ..................... B22F 12/38 |

FOREIGN PATENT DOCUMENTS

| | | |
|---|---|---|
| CN | 101533810 A | 9/2009 |
| CN | 101738122 A | 6/2010 |
| CN | 101839549 A | 9/2010 |
| CN | 110455106 A | 11/2019 |
| CN | 110544106 A | 11/2019 |
| DE | 102020200107 A1 | 7/2021 |
| DE | 102021204758 A1 | 11/2022 |
| DE | 102021214936 A1 | 6/2023 |
| EP | 0751365 A2 | 1/1997 |
| EP | 3011249 A1 | 4/2016 |
| EP | 3153808 A1 | 4/2017 |
| EP | 3203512 A1 | 8/2017 |
| JP | 2002206881 A | 7/2002 |
| JP | 2019196850 A | 11/2019 |
| KR | 20130111035 A | 10/2013 |
| WO | 2020158324 A1 | 8/2020 |

* cited by examiner a)

b)

c)

COOLING DEVICE

BACKGROUND OF THE INVENTION

The present invention relates to a cooling device for cooling components and to an electronic assembly.

Power semiconductors in power electronics usually carry high currents, which can lead to high heat losses. Cooling of such power semiconductors is often necessary, e.g. to avoid damage due to overheating. A liquid cooling system or an air cooling system is usually used for this purpose.

SUMMARY OF THE INVENTION

In contrast, the cooling device according to the invention offers the advantage of improved cooling of components, wherein overheating of the components is reliably avoided by means of a particularly reliable and robust construction. According to the invention, this is achieved by a cooling device comprising a baseplate which can be connected in a heat-conducting manner to a component to be cooled. Moreover, the cooling device has a deflection region and an intermediate region, wherein the intermediate region is arranged between the deflection region and the baseplate.

Furthermore, the cooling device comprises a cooling element. The cooling element is of meandering design and has a plurality of central segments and a plurality of deflection segments. In this context, it is, in particular, a shape which has a plurality of direction changes, preferably in one plane, which is regarded as meandering. Meandering may also be referred to as serpentine, for example.

The central segments of the cooling element each extend from the baseplate to the deflection region. The deflection segments each create a reversal of direction within the baseplate and within the deflection region. Each deflection segment connects two respective central segments to one another. This means that the cooling element is arranged in the intermediate region and, starting from this, extends into the baseplate and into the deflection region, respectively, each time there is a reversal of direction.

The baseplate is preferably formed from aluminum in order to permit good heat conduction and thermal bonding of the component and effective heat removal from the component. As a further preference, the cooling element is likewise formed from aluminum in order to allow an inexpensive and thermally highly conductive connection, for example a brazed connection, to the baseplate.

Furthermore, the cooling element is filled with a working medium which is present simultaneously in the gaseous and the liquid state in the cooling element, in other words is partially gaseous and partially liquid. This means that the working medium is present in two phases in the cooling element. In particular, gas bubbles and liquid columns are simultaneously present within the cooling element. At a nominal temperature, the gas bubbles and the liquid columns preferably occupy a volume of similar size. As a particular preference, the gaseous proportion of the working medium occupies 30% to 70% of an internal volume of the cooling element at the nominal temperature, the remaining internal volume being occupied by the liquid proportion of the working medium. Depending on a temperature of the cooling device, the volume ratio changes due to evaporation or condensation of the working medium.

The cooling element is preferably of tubular design. The cooling element is preferably of closed design. For this purpose, the cooling element preferably has a connecting region, which is preferably situated within the deflection region and which forms a closed circuit of the cooling element. As a further preference, the cooling element has a valve in order, for example, to allow evacuation of the cooling element and filling of the cooling element with the working medium.

The central segments have a multiplicity of channels, preferably at least 4, preferably at least 8, particularly preferably at least 20. The working medium is situated within each of the channels. In this case, each channel preferably forms a cavity, in which the working medium is accommodated. The channels are preferably arranged parallel to one another and adjacent to one another. In particular, the channels are arranged along a direction which is perpendicular to the plane in which the cooling element is formed in a meandering shape.

When heat is supplied to the baseplate, that is to say when the component adjacent to it heats up, the heat is transferred from the baseplate to the cooling element with the working medium situated therein. It is thereby possible to produce a phase change and a flow of the working medium within the cooling element, as a result of which the heat is transported from the baseplate in the direction of the intermediate region. At a surface of the cooling element, in particular of the central regions, the heat is released to the ambient air by convection. In particular, this produces a, in particular irregular, pulsating or oscillating phase transition of the working medium. Likewise, there is, in particular, a pulsating or oscillating flow of the working medium in the cooling element. The cooling device thus operates according to the principle of a pulsating heat pipe.

A particularly good cooling effect can be achieved here by means of the multiplicity of channels of the cooling element. Here, each channel advantageously forms a separate pulsating heat pipe. In particular, there is no need for a power supply, for example an electric power supply; instead, the cooling device operates as a passive cooling element. The cooling device thus offers a particularly effective method for cooling the power electronics and can dissipate waste heat in the range of several kilowatts.

The central segments are preferably surrounded by cooling fins. As a particular preference, an entire free volume of the intermediate region is filled by the cooling fins. In particular, all the free regions between the meandering turns of the cooling element are filled by the cooling fins. In this context, the cooling fins can have any desired geometry. Straight, plate-shaped cooling fins, for example, are particularly simple and inexpensive. Alternatively or additionally, the cooling fins preferably have a wave-shaped, in particular sinusoidal, cross section. As a particular preference, the cooling fins are alternatively or additionally designed in the form of so-called offset strip fins, louvered fins, deeply corrugated fins, or smooth fins. For simple and low-cost production and a thermally highly conductive connection, the cooling fins are preferably formed from aluminum and, in particular, are connected to the cooling element by means of a brazed connection.

The cooling element is preferably formed in one piece as a multichannel tube bent in a meandering shape. In particular, the channels thus each extend over the entire length of the cooling element. The deflection segments are preferably of U-shaped design and have a predefined bending radius. In particular, the bending radius can have a minimum value which is dependent, for example, on a manufacturing process for the multichannel tube. This results in a cooling element which can be produced in a particularly simple and low-cost manner and which makes possible effective heat dissipation from the baseplate. For particularly simple manufacturability, the central segments can be formed parallel to one another.

As a particular preference, the deflection segments, which are arranged within the baseplate and/or within the deflection region, are directly adjacent to one another. The deflection segments thus preferably touch one another, in particular at their outer radius. In other words, the deflection segments are packed as densely as possible in order to accommodate as large a number of deflection segments as possible in the baseplate with a small space requirement, for a particularly high cooling capacity per area. For example, the central segments can be inclined or bent with respect to one another in order to allow the close-together arrangement of the deflection segments.

The deflection segments on the side of the deflection region preferably have a larger bending radius than the deflection segments on the baseplate side. Alternatively or additionally, a lateral spacing between the central segments is increased, at least in some section or sections. As a result, a cooling volume available for the cooling fins, that is to say in particular a free volume in the intermediate region, is increased in order to achieve particularly good heat dissipation and thus a high cooling capacity.

As a further preference, the baseplate has one groove for each deflection segment. Here, each deflection segment on the baseplate side is arranged in a respective groove. In particular, a radius of the groove is matched to an outer radius of the deflection segment in order to provide a contact area which is as large as possible. In this arrangement, the cooling element and the baseplate are preferably connected to one another in the region of the groove by means of a material connection. The material connection is preferably a brazed connection. This ensures particularly simple and low-cost manufacturability of the cooling device and good heat-conducting contact between the plate and the cooling element.

The baseplate preferably has one insert for each groove. The insert is arranged on an inner side, in particular on an inner radius of the deflection segment, and, in particular, can be designed in such a way that it forms a flush arrangement with the baseplate. In this case, the insert preferably has a cross section in the form of a circular segment. As a particular preference, the insert and the deflection segment and/or the baseplate are connected to one another by means of a material connection, preferably a brazed connection. This results in a particularly high surface area available for heat transfer. The insert is preferably formed from aluminum. The insert and baseplate can preferably be formed from an identical aluminum alloy, or alternatively from different aluminum alloys.

The cooling element is preferably of multipart design. In this context, each central segment is designed as a tube section, in particular a straight tube section, which connects the baseplate and the deflection region to one another. All the central segments are preferably of identical design in order to allow particularly simple and low-cost production of the cooling device. For example, the central segments can each be connected to the baseplate and to the deflection region, which is, in particular, designed as a plate, by means of a brazed connection. The central segments are each preferably designed as straight multichannel tube sections, which are, in particular, arranged parallel to one another. It is particularly advantageous if the deflection segments are each designed as a channel within the baseplate and/or within the, in particular plate-shaped, deflection region. Here, the central segments are preferably inserted partially into the respective deflection region in order to open into the latter. Such a design allows a right-angled arrangement of the central segments and of the deflection segments relative to one another, for example. As a result, it is not necessary to maintain a minimum bending radius, thereby enabling the central segments to be arranged closer together. In particular, with the same predefined width of the cooling device, a higher number of central segments can thereby be provided, making possible particularly effective cooling.

As a particular preference, each deflection segment has a single deflection channel, into which all the channels of the two central segments connected by the corresponding deflection segment open. This means that the deflection channel is designed as a cavity, into which in each case all the channels of the adjacent central segments open. As a particular preference, the deflection region is of plate-shaped design, in particular is identical to the baseplate. The baseplate and the deflection region are each preferably of two-part design, as two plates joined together. In this case, a first plate preferably has one through-opening for each central segment, through which the central segment is pushed. A second plate can preferably have a depression, for example a groove or a blind hole, which form the cavity into which the channels of the central segment open. In this case, two adjacent through-openings and the depression connecting the two through-openings each form a deflection segment. This results in particularly simple and low-cost manufacturability of the cooling device, it being possible with small dimensions to provide a particularly high number of central segments.

As a further preference, each deflection segment has a multiplicity of deflection channels. In this case, each deflection channel interconnects two channels of the two central segments connected by the respective deflection segment. Thus, each channel of the cooling element preferably extends through the entire cooling element, each channel forming a separate, in particular closed, cavity. In this case, the deflection region and the baseplate are preferably each designed as a two-part plate, in particular as described in the preceding paragraph, the deflection segment being designed as a combination of two through-openings in a first plate and a depression in a second plate. Here, the depression can have a plurality of dividing walls, and, as a result, for example, a plurality of parallel grooves is present to form the multiplicity of channels. The working medium in the respective channels is thereby held in the corresponding channels in each case and an unwanted pressure equalization is prevented.

As a particular preference, the working medium has a critical temperature which is greater than a maximum operating temperature. The working medium preferably has a critical temperature of at least 233 K, preferably at least 273 K, particularly preferably at least 373 K, and, in particular, not more than 533 K. In this case, a temperature of a substance at the critical point is regarded as the critical temperature. This ensures that the working medium can be present in two phases within the cooling element in a preferred operating range, in which the working medium is present, in particular, at temperatures of 222 K to 473 K, in particular of 273 K to 373 K. The working medium is preferably an organic refrigerant, which is used, for example, in vehicle air-conditioning systems, such as, in particular, 2,3,3,3-tetrafluoropropene, also referred to as R1234yf, R1233zd(E) etc. As a particular preference, the working medium has a melting point which is not more than 273 K, preferably not more than 233 K, particularly preferably not more than 213 K.

The cooling device preferably further comprises a fan, which is configured to generate a cooling air flow. Here, the fan is arranged in such a way that the generated cooling air flow is directed toward the cooling fins, that is to say runs along the cooling fins. Particularly effective heat removal from the cooling fins is thereby accomplished by means of forced convection. Advantageously, the cooling air flow here is perpendicular to the plane in which the meandering shape of the cooling element is defined.

The cooling fins are preferably designed in such a way that a cooling fin surface area increases in the flow direction of the cooling air flow. As a particular preference, the cooling fin surface area increases linearly to compensate for an air temperature which increases as the cooling air flows through the intermediate region. Effective cooling can thereby be accomplished, even in the case of a large number of channels of the central segment, that is to say in the case of a relatively large longitudinal extent. For example, the increase in the cooling fin surface area can be accomplished by means of a cooling fin density which is increased in the direction of flow, in particular by means of an increasing number of cooling fins per cross-sectional area.

As a further preference, the cooling device comprises an air guiding device, which is arranged between the intermediate region and the deflection region. The air guiding device is designed in such a way as to guide the cooling air flow into the intermediate region. Here, the air guiding device is designed as a metal sheet, for example. This ensures that the cooling air flow is guided completely into the intermediate region in order to dissipate the heat from the cooling fins there by forced convection. In particular, the air guiding device ensures shielding of a region of the cooling device which does not contribute to cooling.

Furthermore, the invention leads to an electronic assembly which comprises the cooling device described. Furthermore, the electronic assembly comprises a component to be cooled, which is, in particular, a semiconductor component, for example of a motor vehicle. The component to be cooled is connected in a heat-conducting manner to a baseplate of the cooling device. Here, the cooling device permits particularly effective and reliable cooling of the component in order to avoid overheating.

BRIEF DESCRIPTION OF THE DRAWINGS

The invention is described below with reference to exemplary embodiments in conjunction with the figures. In the figures, functionally identical elements are each denoted by the same reference signs. In the drawings.

DETAILED DESCRIPTION

Figure 1:
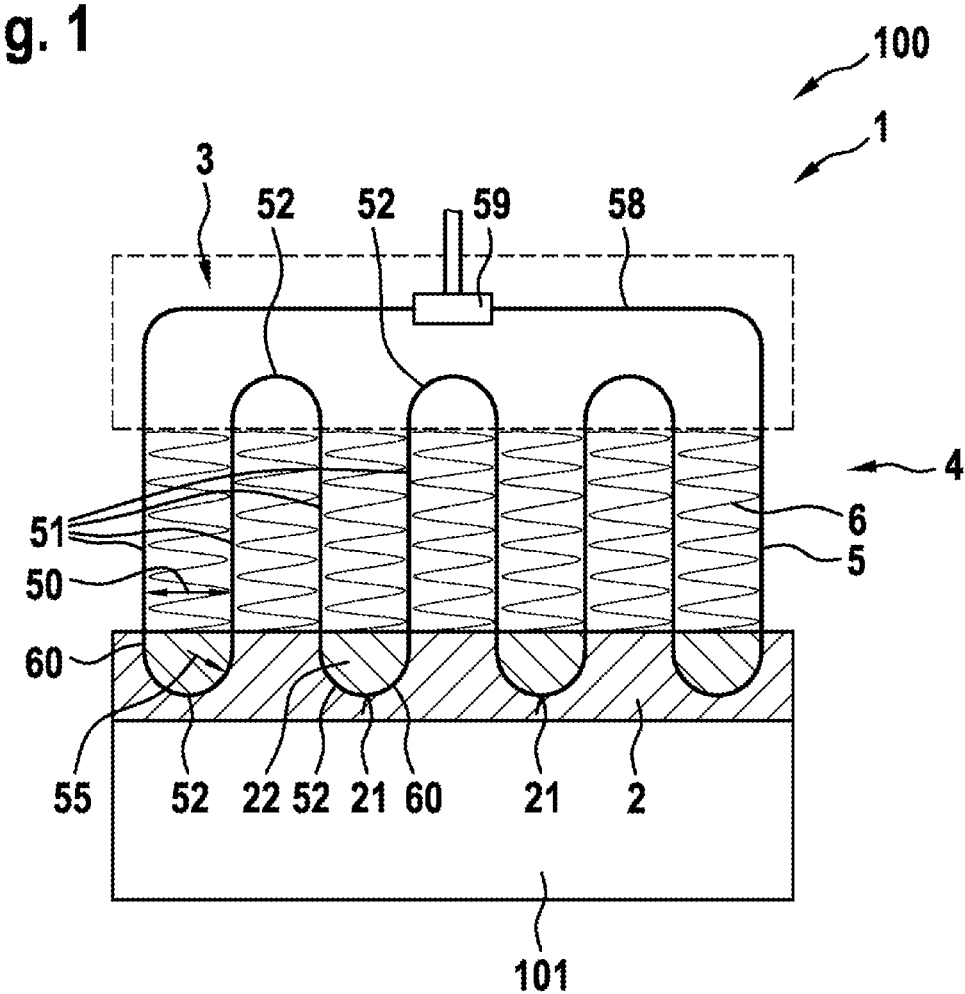
FIG. 1 shows a simplified schematic view of an electronic assembly having a cooling device according to a first exemplary embodiment of the invention.

FIG. 1 shows a simplified schematic view of an electronic assembly 100 according to the invention. The electronic assembly 100 comprises a semiconductor component 101 with power electronics and a cooling device 1 according to a first exemplary embodiment of the invention. In this case, the cooling device 1 is designed to cool the semiconductor component 101. For this purpose, a baseplate 2, which is formed from aluminum, is connected in a heat-conducting manner to the semiconductor component 101.

The cooling device 1 comprises a cooling element 5, which is of meandering design and has a plurality of central segments 51 and a plurality of deflection segments 52. Here, the cooling element 5 is formed in one piece as a multichannel tube bent in a meandering shape.

Figure 2:
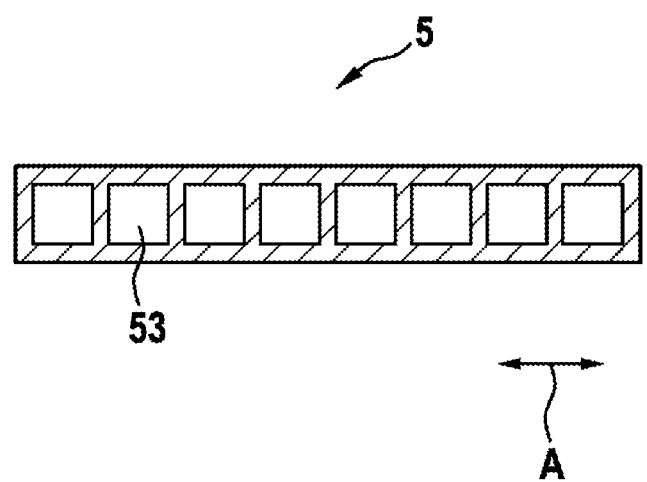
FIG. 2 shows a cross-section taken through the central segment of the cooling element.

FIG. 2 shows a detail of FIG. 1, namely a sectional view of the cooling element 5. As can be seen in FIG. 2, the cooling element 5 has a flat rectangular cross section and has a total of eight mutually separate channels 53, which are arranged next to one another along a longitudinal direction A. It should be noted that, as an alternative, any desired number of channels 53 is possible. In FIG. 1, the longitudinal direction A is perpendicular to the plane of the drawing. The channels 53 each have a square cross section, in particular with an edge length of 0.001 m. The channels 53 each extend through the entire cooling element 5 and form mutually separate cavities.

As can be seen in FIG. 1, the cooling element 5 extends upward from the baseplate 2, through an intermediate region 4, to a deflection region 3. In this case, the intermediate region 4 and the deflection region 3 are preferably filled with air. The central segments 51 each extend from the baseplate 2 to the deflection region 3, that is to say through the intermediate region 4. In this case, all the central segments 51 are of straight design and are arranged parallel to one another. The deflection segments 52 are each arranged at the ends of the central segments 51 within the deflection region 3 and within the baseplate 2 and each create a reversal of direction. In this case, each deflection segment 52 connects two central segments 51 to one another.

The deflection segments 52 are each of U-shaped design and have a bending radius 55. As a result, the central segments 51 are arranged at a distance 50 from one another which corresponds to twice the bending radius 55. On the baseplate side, the deflection segments 52 are each arranged in a groove 21, and therefore there is in each case surface contact of the deflection segments 52 with the baseplate 2 on an outer side of the deflection segment 52.

On an inner side of the deflection segments 52 there are in each case circular-segment-shaped inserts 22, which form a flush arrangement with the baseplate 2. As a result, the heat can be transferred to the cooling element 5, particularly with an especially low temperature difference and uniformly.

In order to enable a firm connection and good heat transfer from the baseplate 2 to the cooling element 5, the deflection segments 52, the baseplate 2 and the inserts 22 are connected to one another by means of brazed joints 60.

Furthermore, the cooling element 5 has a connecting region 58, which is arranged within the deflection region 3 and which provides a closed circuit of the cooling element 5. Provided within the connecting region 58 is a valve 59, which, in the closed state, keeps the cooling element 5 closed and, in the open state, permits evacuation and filling of the channels 53 of the cooling element 5.

Within the channels 53 of the cooling element 5 there is a working medium which is present simultaneously in the liquid and in the gaseous state. When the baseplate 2 is heated by the semiconductor component 101, the cooling element 5 and the working medium therein are heated. By means of a combination of evaporation, condensation, convective heat transfer and heat conduction, the heat is removed from the baseplate 2 and the semiconductor component 101 is thus cooled.

Here, heat is dissipated from the cooling element 5 by cooling fins 6, which are connected to the central segments 51 in a heat-conducting manner. In this case, the cooling fins 6 are arranged within the entire free volume of the intermediate region 4 between the central segments 51. The cooling device 1 thus operates according to the principle of a pulsating heat pipe.

Figure 3:
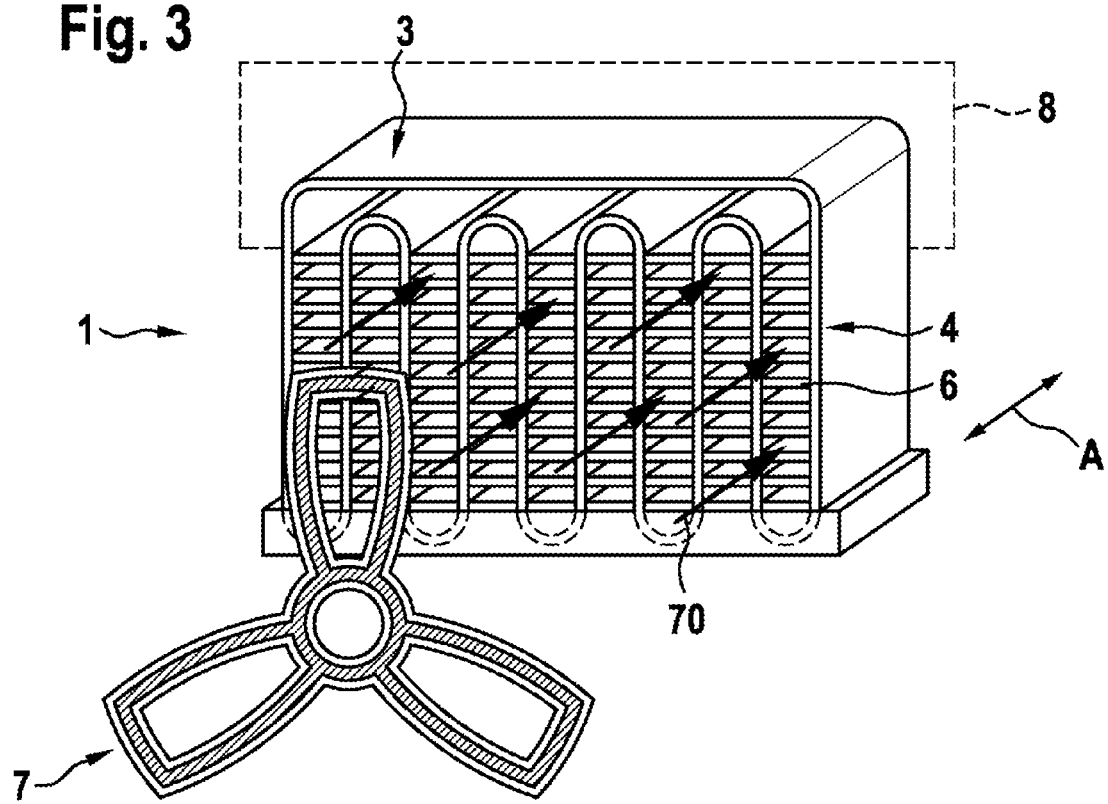
FIG. 3 shows a simplified schematic view of a cooling device according to a second exemplary embodiment of the invention.

FIG. 3 shows a simplified schematic view of a cooling device 1 according to a second exemplary embodiment of the invention. The second exemplary embodiment corresponds substantially to the first exemplary embodiment in FIGS. 1 and 2, the cooling device 1 additionally having a fan 7 and an air guiding device 8. For better illustration of the cooling device 1, the air guiding device 8 is indicated only by dashed lines.

The fan 7 generates a cooling air flow, which is directed onto the cooling fins 6. Here, a flow direction 70 of the cooling air flow is parallel to the longitudinal direction A. The air guiding device 8 is designed as a metal sheet and has the effect that the cooling air flow is guided completely into the intermediate region 4 since the air guiding device 8 shields the deflection region 3. By virtue of the flow of cooling air, there is particularly good heat removal from the cooling fins 6 by means of forced convection in order to obtain a particularly high cooling capacity of the cooling device 1.

Figure 4:
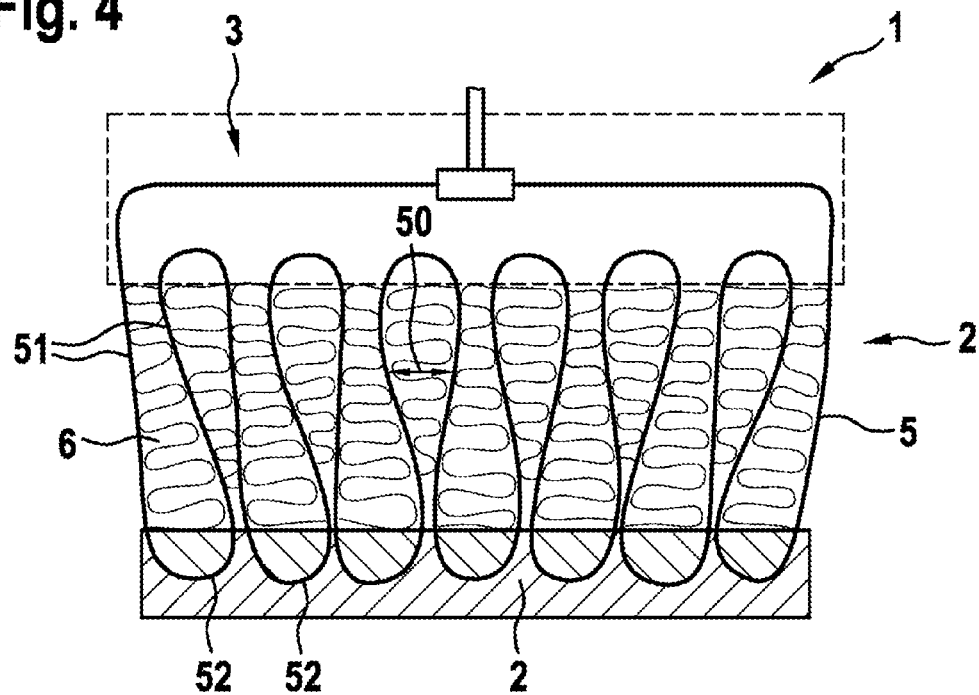
FIG. 4 shows a simplified schematic view of a cooling device according to a third exemplary embodiment of the invention.

FIG. 4 shows a simplified schematic view of a cooling device 1 according to a third exemplary embodiment of the invention. The third exemplary embodiment corresponds substantially to the first exemplary embodiment in FIGS. 1 and 2, with an alternative arrangement of the cooling element 5. In the third exemplary embodiment in FIG. 4, the deflection segments 52 are arranged directly adjacent to one another, and therefore there is space in the baseplate 2 for a larger number of deflection segments 52. It is thereby possible to increase a cooling capacity of the cooling device 1 per volume. In order to allow the more densely packed arrangement of the deflection segments 52, the central segments 51 are of curved design, with the result that the cooling element 5 has a geometry with a plurality of dumbbell-shaped loops.

Figure 5:
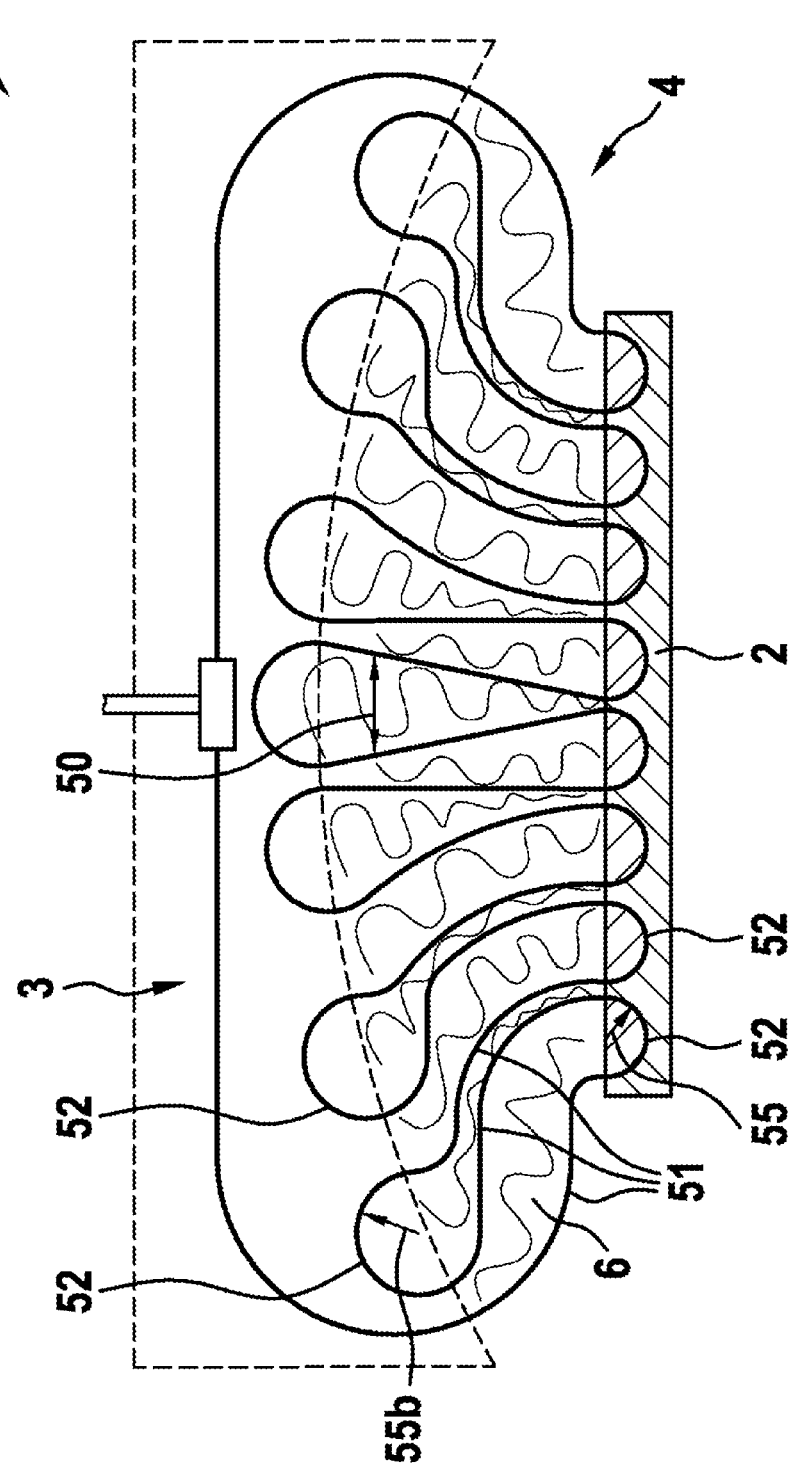
FIG. 5 shows a simplified schematic view of a cooling device according to a fourth exemplary embodiment of the invention.

FIG. 5 shows a simplified schematic view of a cooling device 1 according to a fourth exemplary embodiment of the invention. The fourth exemplary embodiment corresponds substantially to the third exemplary embodiment in FIG. 4, the deflection segments 52 on the side of the deflection region having an enlarged bending radius 55b compared to the deflection segments 52 on the baseplate side. Moreover, the lateral spacing 50 between the central segments 51 is increased in the vicinity of the deflection region 3. In order to achieve this, the deflection region 3 is widened in comparison with the baseplate 2. These measures thus offer a larger free volume in the intermediate region 2 in order to offer more free space for the cooling fins 6, enabling a particularly high cooling capacity to be achieved.

Figure 6:
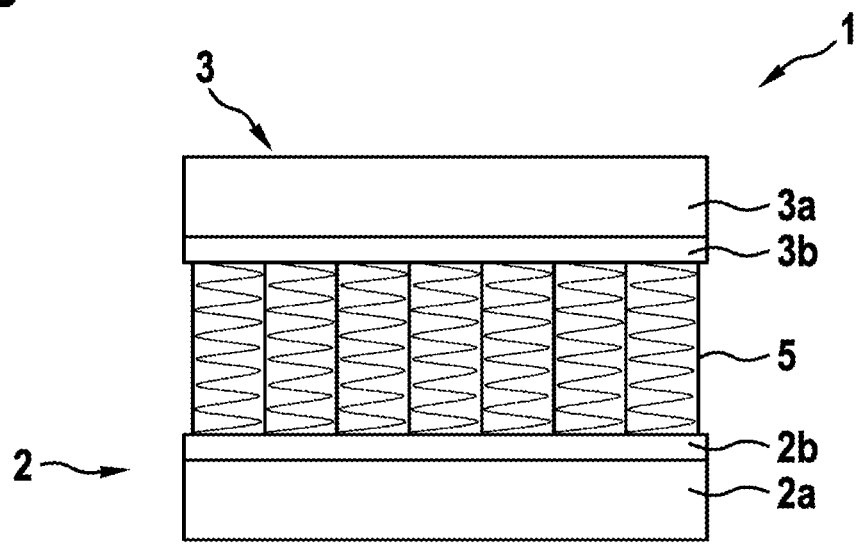
FIG. 6 shows a simplified schematic view of a cooling device according to a fifth exemplary embodiment of the invention.
Figure 7:
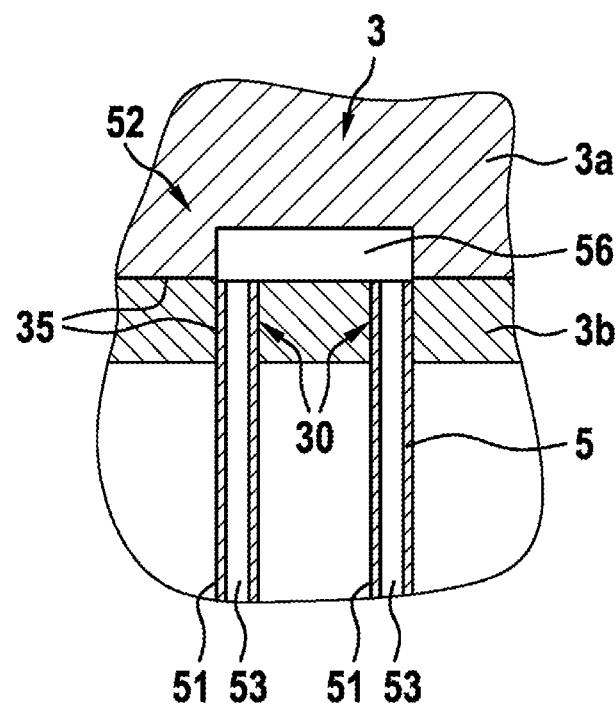
FIG. 7 shows a detail of the cooling device of FIG. 6.

FIG. 6 shows a simplified schematic view of a cooling device 1 according to a fifth exemplary embodiment of the invention. FIG. 7 shows a detail sectional view of FIG. 6. The fifth exemplary embodiment corresponds substantially to the first exemplary embodiment in FIGS. 1 and 2, with an alternative design of the cooling element 5 and the baseplate 2 and the deflection region 3. In the fifth exemplary embodiment, the baseplate 2 is formed in two parts, from two plates 2a, 2b. The deflection region 3 has a similar two-part construction with a first plate 3a and a second plate 3b.

Moreover, in the fifth exemplary embodiment, the cooling element 5 is of multipart design. In this case, the cooling element 5 comprises a plurality of individual straight central segments 51 designed as multichannel tubes.

The structure of the cooling element 5 is illustrated by way of example with reference to a single reversal of direction around deflection region 3 in FIG. 7. Here, the second plate 3b has one through-opening 30 for each central segment 51, through which the central segment 51 is pushed. Adjacent thereto, a deflection channel 56 in the form of a groove is formed within the first plate 3a. The deflection channel 56 connects the two adjacent central segments 51 to one another. In this case, the deflection channel 56 provides the reversal of direction in the deflection segment 52. In addition, the deflection channel 56 is designed in the form of a single cavity, into which all the channels 53 of the respectively adjoining central segments 51 open. For fluidtight connection and to ensure good heat conduction, respective brazed connections 35 are provided at the contact surfaces between the first plate 3a and the second plate 3b and between the central segments 51 and the second plate 3b.

Figure 8:
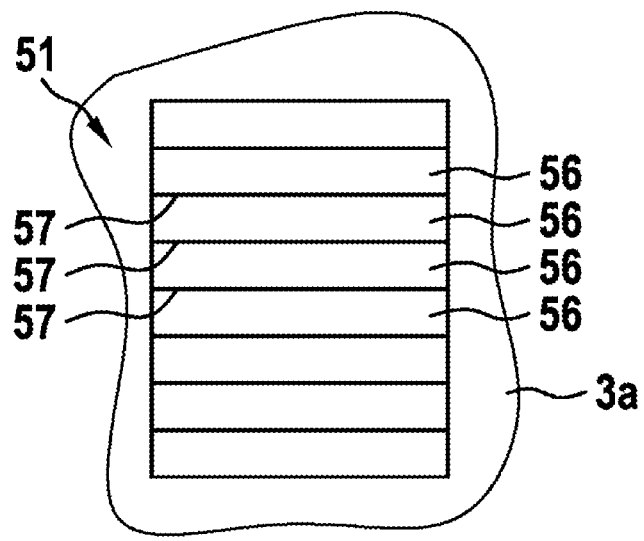
FIG. 8 shows a detail of a cooling device according to a sixth exemplary embodiment of the invention, and FIGS. 9a), b) and c) show simplified schematic detail views of a cooling device according to a seventh exemplary embodiment of the invention.

FIG. 8 shows a detail of a cooling device 1 according to a sixth exemplary embodiment of the invention. The sixth exemplary embodiment corresponds substantially to the fifth exemplary embodiment in FIGS. 6 and 7, the deflection segment 52 having a multiplicity of deflection channels 56 instead of a single one. FIG. 8 shows a plan view of the first plate 3a, in which the plurality of deflection channels 56 are each formed as grooves. A dividing wall 57 is formed between each of the individual deflection channels 56. As a result, there is exactly one deflection channel 56 for each channel 53 of the central segment 51, and therefore no exchange of the working medium can take place between the individual channels 53.

Figure 9:
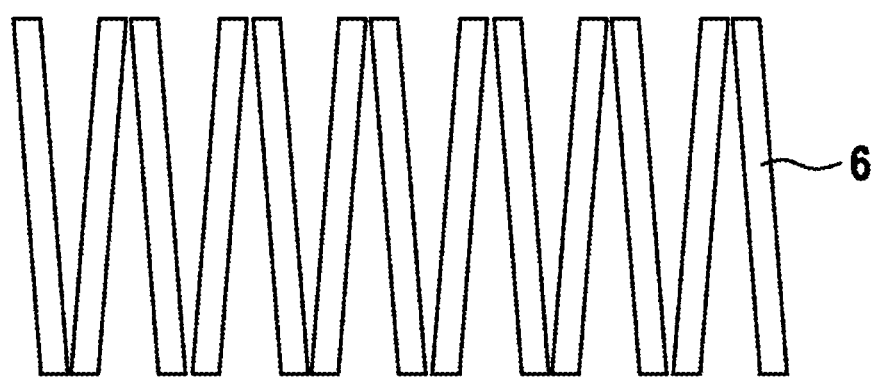
Figure 9:
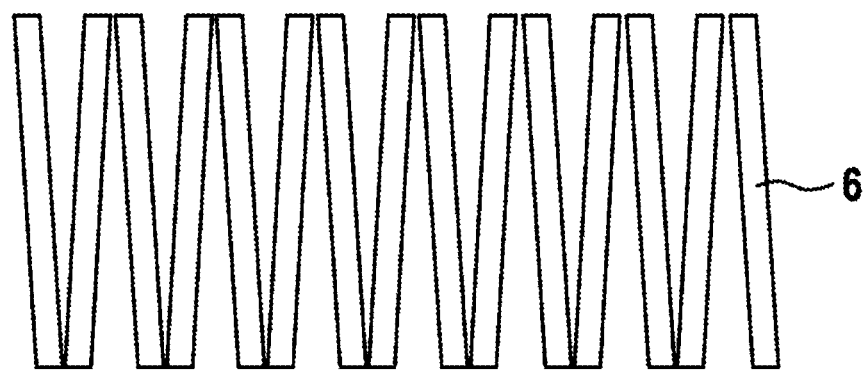
Figure 9:
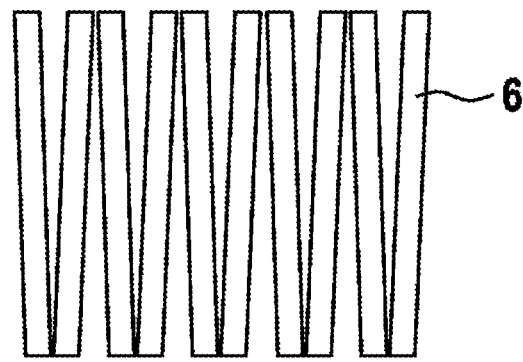

FIG. 9 shows simplified schematic detail views of a cooling device 1 according to a seventh exemplary embodiment of the invention. The seventh exemplary embodiment corresponds substantially to the second exemplary embodiment in FIG. 3, with an alternative arrangement of the cooling fins 6. FIG. 9 illustrates three views of the cooling fins 6 in different section planes along the flow direction 70, which is, in particular, perpendicular to the plane of the drawing. Here, figure (a) shows a plan view of the cooling fins 6 in an entry plane of the cooling air flow into the region of the cooling device 1 filled with cooling fins 6. View (b) shows the cooling fins 6 in a section plane in the flow direction 70 downstream of the geometry illustrated in view (a), and view (c) shows the cooling fins 6 in a section plane in the flow direction 70 downstream of the geometry illustrated in view (b). As can be seen in FIG. 9, a fin density per volume here increases in the flow direction 70. As a result, a cooling fin surface area also increases along the flow direction 70. As a result, the cooling fin surface area available for convective heat transfer increases in the flow direction 70. In this way, heating of the flow of cooling air, which increases in the flow direction 70, can be compensated by the heat absorbed in order to obtain particularly effective heat removal over the entire volume of the cooling device 1.

What is claimed is:

1. A cooling device for cooling components (101), the cooling device comprising:
   a baseplate (2) which can be connected in a heat-conducting manner to a component (101) to be cooled,
   a deflection region (3) including a first plate (3*a*) and a second plate (3*b*),
   an intermediate region (4) between the baseplate (2) and the deflection region (3), and
   a cooling element (5), which has a meandering configuration and has a plurality of central segments (51) and a plurality of deflection segments (52),
   wherein the central segments (51) each extend from the baseplate (2) to the deflection region (3),
   wherein the deflection segments (52) each create a reversal of direction within the baseplate (2) and within the deflection region (3) and connect two respective central segments (51) to one another,
   wherein the central segments (51) extend through the second plate (3*b*),
   wherein the first plate (3*a*) includes a groove in fluid communication with the central segments (51),
   wherein the groove of the first plate (3*a*) is configured as a deflection channel (56) and is configured to connect two adjacent channels of the central channels (51),
   wherein the cooling element (5) is filled with a working medium which is present simultaneously in a gaseous and a liquid state in the cooling element (5), and
   wherein the central segments (51) have a multiplicity of channels (53),
   wherein the first plate (3*a*) and the second plate (3*b*) are brazed to the central segments (51).

2. The cooling device as claimed in claim 1, wherein the central segments (51) are surrounded by cooling fins (6).

3. The cooling device as claimed in claim 2, wherein a lateral spacing (50) between the central segments (51) is increased, at least in some section or sections, in order to increase a cooling volume available for the cooling fins (6).

4. The cooling device as claimed in claim 1, wherein the baseplate (2) has one groove (21) for each deflection segment (52), and wherein each deflection segment (52) on a baseplate side is arranged in a respective groove (21).

5. The cooling device as claimed in claim 4, wherein the baseplate (2) has one insert (22) for each groove (21), which insert is arranged on an inner side of the deflection segment (52) and is configured for flush arrangement with the baseplate (2).

6. The cooling device as claimed in claim 1,
   wherein the cooling element (5) is of multipart configuration, and
   wherein the central segments (51) are configured as a plurality of tube sections connecting the baseplate (2) and the deflection region (3).

7. The cooling device as claimed in claim 6, wherein each deflection segment (52) has a single deflection channel (56), into which in each case all the channels (53) of the two connected central segments (51) open.

8. The cooling device as claimed in claim 6, wherein each deflection segment (52) has a multiplicity of deflection channels (56), wherein each deflection channel (56) of a deflection segment (52) interconnects two channels (53) of the two connected respective central segments (51).

9. The cooling device as claimed in claim 1, wherein the working medium has a critical temperature of at least 333 K.

10. The cooling device as claimed in claim 2, further comprising a fan (7) which is configured to generate a cooling air flow, wherein the cooling air flow is directed towards the cooling fins (6).

11. The cooling device as claimed in claim 10, wherein the cooling fins (6) are configured in such a way that a cooling fin surface area increases in a flow direction (70) of the cooling air flow.

12. The cooling device as claimed in claim 10, further comprising an air guiding device (8), which is arranged between the intermediate region (4) and the deflection region (3) and which guides the cooling air flow into the intermediate region (4).

13. An electronic assembly comprising:
    a semiconductor component, and
    a cooling device (1) as claimed in claim 1,
    wherein the component (101) is connected in a heat-conducting manner to a baseplate (2) of the cooling device (1).

* * * * *